United States Patent
Liao et al.

(10) Patent No.: US 10,578,910 B2
(45) Date of Patent: Mar. 3, 2020

(54) SUBSTRATE FOR DISPLAY PANEL, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Liqing Liao, Beijing (CN); Zhifu Dong, Beijing (CN); Dong Wang, Beijing (CN); Hongmin Li, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/940,517

(22) Filed: Mar. 29, 2018

(65) Prior Publication Data

US 2019/0101790 A1 Apr. 4, 2019

(30) Foreign Application Priority Data

Sep. 30, 2017 (CN) .......................... 2017 1 0919638

(51) Int. Cl.
*G02F 1/1335* (2006.01)
*H01L 27/12* (2006.01)
(Continued)

(52) U.S. Cl.
CPC ...... *G02F 1/133514* (2013.01); *G02F 1/1368* (2013.01); *G02F 1/13363* (2013.01);
(Continued)

(58) Field of Classification Search
CPC ................................................. G02F 1/133514
See application file for complete search history.

(56) References Cited

U.S. PATENT DOCUMENTS

| 2008/0094691 | A1 | 4/2008 | Monch et al. |
| 2009/0088310 | A1* | 4/2009 | Suzuki .................... C03C 3/068 |
| | | | 501/78 |

(Continued)

FOREIGN PATENT DOCUMENTS

| CN | 101111801 A | 1/2008 |
| CN | 203191665 U | 9/2013 |

(Continued)

OTHER PUBLICATIONS

First Chinese Office Action dated Nov. 5, 2019, received for corresponding Chinese Application No. 201710919638.9, 23 pages.

*Primary Examiner* — Edmond C Lau
(74) *Attorney, Agent, or Firm* — Kinney & Lange, P.A.

(57) ABSTRACT

The present disclosure relates to a substrate for a display panel, a display panel and a display device. The substrate according to the present disclosure comprises a base doped with upconverting ions capable of converting an infrared light beam into a visible light beam, the base is made of microcrystalline glass, and the microcrystalline glass comprises at least one of matrix materials $NaYF_4$ and $NaGdF_4$. The substrate according to the present disclosure may be used for any of a color filter substrate, an array substrate and a coverplate of the display panel.

14 Claims, 5 Drawing Sheets

(51) Int. Cl.
 *G02F 1/1368* (2006.01)
 *G02F 1/13363* (2006.01)
 *G02F 1/1333* (2006.01)

(52) U.S. Cl.
 CPC .. *G02F 1/133308* (2013.01); *G02F 1/133512* (2013.01); *G02F 1/133528* (2013.01); *G02F 1/133553* (2013.01); *H01L 27/1214* (2013.01); *G02F 2001/133638* (2013.01)

(56) References Cited

U.S. PATENT DOCUMENTS

| | | | |
|---|---|---|---|
| 2013/0276877 A1* | 10/2013 | Dionne | H01L 31/022425 |
| | | | 136/256 |
| 2016/0041429 A1 | 2/2016 | Wang et al. | |
| 2016/0187663 A1* | 6/2016 | Kim | F21V 9/30 |
| | | | 362/259 |
| 2016/0370611 A1* | 12/2016 | Jiang | G02F 1/1303 |
| 2016/0370656 A1 | 12/2016 | Zhang et al. | |
| 2017/0066681 A1* | 3/2017 | Wada | C03C 3/085 |
| 2017/0267922 A1* | 9/2017 | Kamada | C09K 11/06 |
| 2018/0157098 A1* | 6/2018 | Choung | G02F 1/133512 |

FOREIGN PATENT DOCUMENTS

| | | |
|---|---|---|
| CN | 104267520 A | 1/2015 |
| CN | 104516149 A | 4/2015 |
| WO | 2015030413 A1 | 3/2015 |

* cited by examiner

SUBSTRATE FOR DISPLAY PANEL, DISPLAY PANEL AND DISPLAY DEVICE

CROSS-REFERENCE TO RELATED APPLICATION

This application claims a priority to Chinese Patent Application No. 201710919638.9 filed on Sep. 30, 2017, the disclosures of which are incorporated in their entirety by reference herein.

TECHNICAL FIELD

The present disclosure relates to the field of display technology, in particular to a substrate for a display panel, a display panel, and a display device.

BACKGROUND

Liquid crystal display technology is a mature technology, and liquid crystal display panels using liquid crystal display technology are widely used. Some liquid crystal display panels include transmissive display panels and reflective display panels for use with different light sources for illuminating the display screen. In some cases reflective display panels are provided with a reflective material layer under the liquid crystal panel instead of the backlight source of the transmissive display panel. When there is sufficient light in the surrounding environment (in a sunny outdoor setting, for example), the reflective display panel utilizes the reflection of ambient light by the reflective material to illuminate the screen, thereby realizing the image display.

SUMMARY

According to a first aspect of the present disclosure, a substrate for a display panel is provided which comprises a base doped with upconverting ions capable of converting an infrared light beam into a visible light beam, wherein the base is made of microcrystalline glass, and the microcrystalline glass comprises at least one of matrix materials $NaYF_4$ and $NaGdF_4$.

In an embodiment of the present disclosure, the upconverting ions comprise one or more of $Yb^{3+}$, $Er^{3+}$, $Tm^{3+}$ and $Ho^{3+}$.

In an embodiment of the present disclosure, the base comprises one or more selected from the group consisting of $NaYF_4:Yb^{3+}$; $NaYF_4:Er^{3+}$; $NaYF_4:Tm^{3+}$; $NaYF_4:Ho^{3+}$; $NaGdF_4:Yb^{3+}$; $NaGdF_4:Er^{3+}$; $NaGdF_4:Tm^{3+}$; $NaGdF_4:Ho^{3+}$; and $NaGdF_4:Yb^{3+}$, $Er^{3+}$, $Tm^{3+}$.

In an embodiment of the present disclosure, the microcrystalline glass comprises 65 mol % to 70 mol % $SiO_2$, 5 mol % to 10 mol % $Ba_2O_3$, 5 mol % to 10 mol % $Na_2O$, 5 mol % to 10 mol % NaF, and 5 mol % to 10 mol % $GdF_3$.

In an embodiment of the present disclosure, the microcrystalline glass comprises 65 mol % to 70 mol % $SiO_2$, 5 mol % to 10 mol % $Ba_2O_3$, 5 mol % to 10 mol % $Na_2O$, 5 mol % to 10 mol % NaF, 0.5 mol % to 5 mol % $YF_3$.

In an embodiment of the present disclosure, based on total molar content of the matrix materials, each of the upconverting ions is doped at a molar ratio of 0.5-2 mol %, alternatively at a molar ratio of 0.5-1.5 mol %, even alternatively 0.5-1.0 mol %.

In an embodiment of the present disclosure, the substrate serves as one of a color filter substrate, an array substrate and a coverplate of the display panel.

According to a second aspect of the present disclosure, a display panel is provided which comprises a color filter substrate and an array substrate provided opposite to the color filter, wherein the color filter substrate or the array substrate comprises the substrate according to any of the above embodiments, and the display panel further comprises a liquid crystal layer between the color filter substrate and the array substrate, a reflecting layer on a side of the array substrate which faces the liquid crystal layer, or on other side of the array substrate which is away from the liquid crystal layer, and a polarization structure between the color filter substrate and the liquid crystal layer.

In an embodiment of the present disclosure, the microcrystalline glass may comprise 65 mol % to 70 mol % $SiO_2$, 5 mol % to 10 mol % $Ba_2O_3$, 5 mol % to 10 mol % $Na_2O$, 5 mol % to 10 mol % NaF, 5 mol % to 10 mol % $GdF_3$.

In an embodiment of the present disclosure, the microcrystalline glass may comprise 65 mol % to 70 mol % $SiO_2$, 5 mol % to 10 mol % $Ba_2O_3$, 5 mol % to 10 mol % $Na_2O$, 5 mol % to 10 mol % NaF, 0.5 mol % to 5 mol % $YF_3$.

In an embodiment of the present disclosure, based on total molar content of the matrix materials, the upconverting ions are doped at a molar ratio of 0.5-2%, alternatively at a molar ratio of 0.5-1.5%, even alternatively 0.5-1.0%.

In an embodiment of the present disclosure, the substrate according to any of the above embodiments is provided on the color filter substrate, the polarization structure comprises a first polarization layer between the color filter substrate and the liquid crystal layer, and the first polarization layer comprises a linear polarizer and a quarter wave plate sequentially arranged on a side of the color filter substrate which faces the liquid crystal layer.

In an embodiment of the present disclosure, the polarization structure further comprises a half wave plate between the liquid crystal layer and the reflecting layer.

In an embodiment of the present disclosure, the substrate according to any of the above embodiments is provided on the array substrate, the polarization structure comprises a second polarization layer on a side of the color filter substrate which faces the liquid crystal layer, or on other side of the color filter substrate which is away from the liquid crystal layer; and a third polarization layer is provided between the liquid crystal layer and the reflection layer.

According to a third aspect of the present disclosure, there is provided a display panel comprising a coverplate comprising the substrate according to any of the above embodiments, a color filter substrate, an array substrate provided opposite to the color filter substrate, a liquid crystal layer between the color filter substrate and the array substrate, a fourth polarization layer on a side of the color filter substrate which faces the liquid crystal layer, or on other side of the color filter substrate which is away from the liquid crystal layer, and a reflecting layer on a side of the array substrate which faces the liquid crystal layer, or on other side of the array substrate which is away from the liquid crystal layer. The fourth polarization layer comprises a linear polarizer and a quarter wave plate sequentially provided on a side of the color filter substrate which faces the liquid crystal layer; and In an embodiment of the present disclosure, the display device further comprises a half wave plate between the liquid crystal layer and the reflecting layer.

According to a fourth aspect of the present disclosure, the display device comprises the substrate according to the above embodiments or the display panel according to the above embodiments.

BRIEF DESCRIPTION OF THE DRAWINGS

The accompanying drawings described herein are for purpose of illustration of only selected embodiments, do not encompass all possible implementations, and are not intended to limit the scope of the present application.

Figure 1:
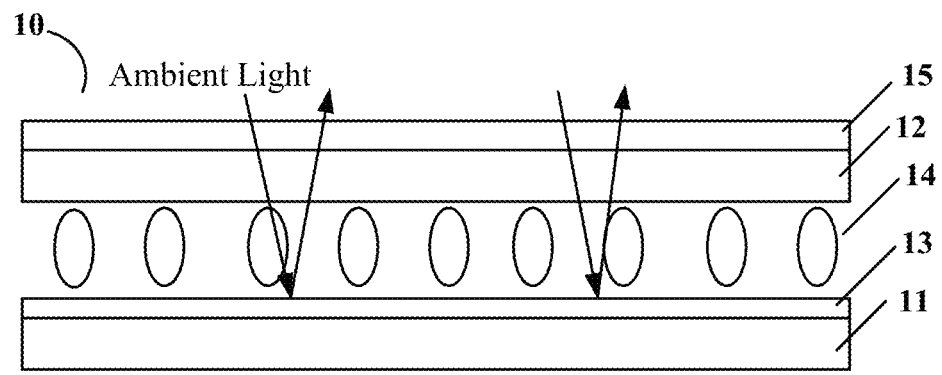
FIG. 1 shows a schematic cross-sectional view of the reflective display panel in related art.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Various embodiments are described in detail below with reference to the accompanying drawings, which are provided as illustrative examples of the present disclosure so as to enable those skilled in the art to implement the disclosure. Notably, the accompanying drawings and embodiments herein are not intended to limit the scope of the present disclosure.

Where certain elements of the present disclosure may be partially or fully implemented using known components (or methods or processes), only those portions of such known components (or methods or processes) that are necessary for understanding of the present disclosure will be described, and the detailed descriptions of other portions of such known components (or methods or processes) will be omitted so as not to obscure the disclosure. Further, various embodiments encompass present and future known equivalents to the components referred to herein by way of illustration.

As used herein, the terms "have", "comprise" and "include" are used in a non-exclusive manner. Thus the expressions "A has B", "A comprises B" and "A includes B" all indicate a condition that besides B, A further includes one or more additional components and/or constitute elements and a condition that besides B, any other component, constitute element or member is not presented in A.

In the description of the present disclosure, the orientation or position relationships indicated by the terms "on", "above", "under", "below", "top", "bottom", "between" etc. are based on the orientation or position relationship as illustrated in the accompanying drawings. These terms are only used to illustrate the embodiments of the present disclosure but do not indicate or imply that the apparatus or elements must have specific orientations and be constructed and operated at specific orientations, and thus can not be construed an limitation on the present disclosures. In addition, when an element or layer is referred to as being "on" another element or layer, it may be directly located on another element or layer, or there may be an intermediate layer therebetween. Likewise, when an element or layer is referred to as being "under" another element or layer, it may be directly located under another element or layer, or there may be at least one intermediate element or layer therebetween; and when an element or layer is referred to as being "between" two layers or elements, it may be an unique layer or element between the two elements or layers, or there may be more than one intermediate element or layer.

FIG. 1 shows a schematic cross-sectional view of the reflective display panel 10 in related art. As shown in FIG. 1, the reflective display panel may comprise an array substrate 11, an color filter substrate 12 disposed opposite to the array substrate 11, a reflecting layer 13 on the array substrate 11, a liquid crystal layer 14 between the color filter substrate 12 and the reflecting layer 13, and the polarization layer 15 on the color filter substrate 12. When the reflective display panel 10 is in a well-lighted environment, ambient light sequentially passes through the polarization layer 15, the color filter substrate 12 and the liquid crystal layer 14 and then is incident to the reflecting layer 13, after that, the light is reflected by the reflecting layer 13, and passes through again the liquid crystal layer 14, the color filter substrate 12 and the polarization layer 15, thereby utilized by the display panel. The intensity of the reflected ambient light emitted from the display panel can be controlled by setting a suitable thickness of the liquid crystal layer and controlling the orientation of the liquid crystal molecules (for example, by applying suitable voltage) so as to achieve the image display of the display panel.

The reflective display panel has the following advantages: no need of a backlight source, and saving energy. However, the reflective display panel has strong dependence on ambient light. The reflective display panel may not be normally displayed in the case of weak ambient light. Generally, ambient light contains light in various wavebands from infrared light to ultraviolet light in the electromagnetic spectrum, but only visible light can be utilized by the display panel, while the infrared light spectrum occupying a wide range of the electromagnetic spectrum may not be fully utilized. Therefore, the application environment of the reflective display panel is limited.

In a first aspect of the present disclosure, a substrate for a display panel is provided which comprises a based doped with upconverting ions capable of converting an infrared light beam into a visible light beam, wherein the base is made of microcrystalline glass, and the microcrystalline glass comprises at least one of matrix materials $NaYF_4$ and $NaGdF_4$. As a substrate for the display panel, it may convert at least a part of an infrared light beam in ambient light into a visible light beam, thus the intensity of the reflected light in the reflective display panel can be increased and the application environment of the display panel can be widened.

Figure 2:
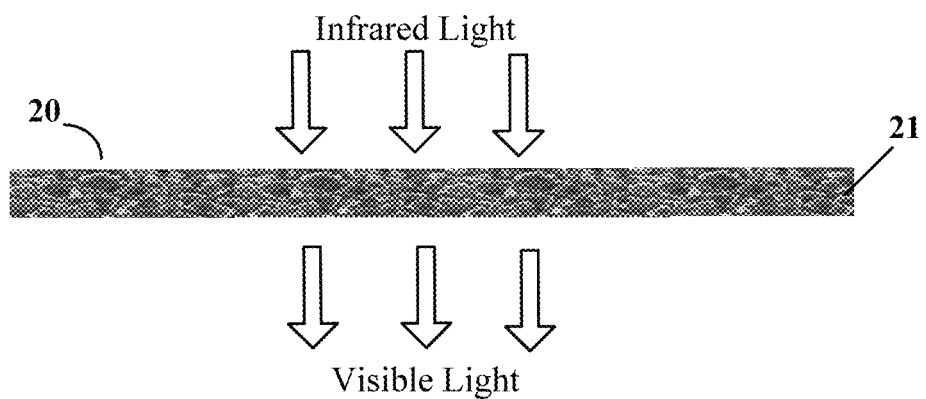
FIG. 2 shows a schematic view of a substrate for display panels according to an embodiment of the present disclosure.

FIG. 2 shows a schematic view of a substrate 20 for display panels according to an embodiment of the present disclosure. The substrate 20 may comprise a base 21 doped with upconverting ions capable of converting an infrared light beam into a visible light beam. In an embodiment of the present disclosure, the base 21 doped with upconverting ions is able to convert an infrared light beam into a visible light beam.

The substrate provided according to an embodiment of the present disclosure may be used for any one of a color filter substrate, an array substrate and a coverplate of the display panel.

When the substrate provided by any of embodiments of the present disclosure is used for a color filter substrate of the display panel, a black matrix and a color filter, for example, may be also provided on the substrate; when the substrate provided by any of embodiments of the present disclosure is used for an array substrate of the display panel, a thin film transistors arranged in an array, for example, may also be provided on the substrate; when the substrate provided by any of embodiments of the present disclosure is used for a coverplate of the display panel, the cover plate may serve as the protective layer of the display panel.

When the substrate provided by any of embodiments of the present disclosure is used for the display panel (especially a reflective display panel), an infrared light beam in ambient light may be converted into a visible light beam, thus the brightness of the reflected light in the reflective display panel can be increased and the application environment of the display panel can be widened.

In an embodiment of the present disclosure, the material constituting the base 21 may comprise microcrystalline glass. The microcrystalline glass may comprise one or more matrix materials such as $NaYF_4$ and $NaGdF_4$.

Microcrystalline glass is a mixture of microcrystal and glass which are made by sintering and crystallizing glass particles. Microcrystalline glass combines the high transparency of glass (transmittance greater than 96%) with the toughness of crystal. In addition to the above characteristics, the microcrystalline glass doped with upconverting ions has upconverting performance for upconverting long-waveband infrared light beam into a visible light beam. According to an embodiment of the present disclosure, upconverting ions comprise rare earth ions, for example, one or more of $Yb^{3+}$, $Er^{3+}$, $Tm^{3+}$ and $Ho^{3+}$.

The matrix materials and the upconverting ions may be previously synthesized as microcrystalline particles, which are then incorporated into the microcrystalline glass material. Alternatively, the matrix materials and the upconverting ions may be directly synthesized as microcrystalline glass, and the base is formed from such microcrystalline glass. In view of upconversion efficiency, the matrix materials and the upconverting ions may be previously synthesized as microcrystalline particles, which are then incorporated into the microcrystalline glass material. For example, the following microcrystalline particles can be previously synthesized: $NaYF_4:Yb^{3+}$; $NaYF_4:Er^{3+}$; $NaYF_4:Tm^{3+}$; $NaYF_4:Ho^{3+}$; $NaGdF_4:Yb^{3+}$; $NaGdF_4:Er^{3+}$; $NaGdF_4:Tm^{3+}$; $NaGdF_4:Ho^{3+}$; and $NaGdF_4:Yb^{3+}, Er^{3+}, Tm^{3+}$.

As an example, when $NaYF_4$ or $NaGdF_4$ serves as the base, the microcrystalline glass material doped with $Yb^{3+}$ and $Er^{3+}$ can absorb an infrared light beam and emit a green light beam; the microcrystalline glass material doped with $Tm^{3+}$ and $Ho^{3+}$ can absorb an infrared light beam and emit a blue light beam and a red light, respectively; the $NaGdF_4$ microcrystalline glass simultaneously doped with $Er^{3+}$, $Tm^{3+}$, $Yb^{3+}$ can emit a white light beam by upconversion.

In an embodiment of the present disclosure, the infrared light has a wavelength ranging from 960 to 1020 nm. However, it is understood that an infrared light of other wavebands can also be upconverted into a visible light by doping with appropriate types of rare earth ions.

Figure 3:
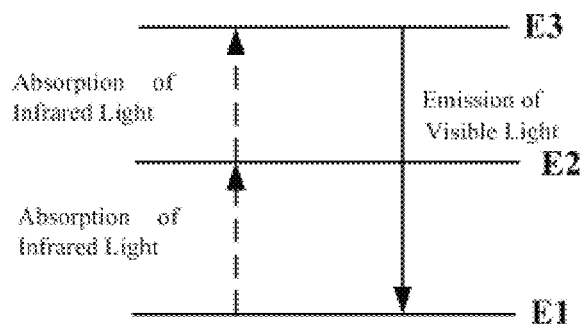
FIG. 3 shows the exemplary process of upconversion luminescence.

FIG. 3 shows the exemplary process of upconversion luminescence. The microcrystalline glass material doped with rare earth ions has three energy levels E1, E2 and E3. When irradiated by an infrared light beam with longer wavelengths (lower energy), the electrons in the ground state E1 absorb a photon with lower energy and jump to the level E2. Since the energy difference between E2 and E1 and that between E3 and E2 are relatively similar, the electrons in the excited state E2 have a certain chance of sequentially absorbing one photon and jumping to the level E3. Eventually, the electrons in the excited state E3 return to the ground state E1 by the deexcitation, and simultaneously emit visible light with short wavelength.

In an embodiment of the present disclosure, the microcrystalline glass may be prepared by a float process. For example, in the case of $NaGdF_4$ serving as a matrix, the composition ratio (molar ratio) of the microcrystalline glass may comprise 65% to 70% $SiO_2$; 5% to 10% $Ba_2O_3$; 5% to 10% $Na_2O$; 5% to 10% NaF; and 5% to 10% $GdF_3$; in the case of $NaYF_4$ serving as a matrix, the composition ratio (molar ratio) of the microcrystalline glass may comprise 65% to 70% $SiO_2$; 5% to 10% $Ba_2O_3$; 5% to 10% $Na_2O$; 5% to 10% NaF; and 0.5% to 5% $YF_3$. In order to achieve white light upconversion, the base is doped with rare earth ions $Er^{3+}$, $Tm^{3+}$ and $Yb^{3+}$ with a concentration for each rare earth ion of 0.5% to 2% (molar ratio). The concentration for each rare earth ion refers to a molar concentration relative to the total molar amount for all components in the matrix materials such as $NaGdF_4$ and $NaYF_4$. After the glass substrate is formed by high-temperature float cooling, the microcrystal growth is performed by annealing at a low temperature (for example, 300 to 500° C.) for 1 to 2 hours.

In an embodiment of the present disclosure, rare earth ions are usually doped in the form of fluorides thereof, for example $ErF_3$ and $TmF_3$. Certainly, other types of compounds doped with rare earth ions, for example oxides of rare earth ions, are available. In an embodiment of the present disclosure, in the case where there is only one rare earth ion in the chemical formula of a rare earth ion compound, the doping mole ratio of rare earth ion is equal to that of the rare earth ion compound. In the case where there are more than one rare earth ions in the chemical formula of a rare earth ion compound, the doping mole ratio of rare earth ions may refer to the molar ratio of rare earth ions themselves. As an example, when doped with an oxide of rare earth ions having two rare earth ions therein, the doping mole ratio of rare earth ions is equal to double the molar ratio of the doped oxide.

In the studying, the inventor found that in the doping mole ratio of less than 5 mol %, the higher the concentration of $Er^{3+}$, $Tm^{3+}$ and $Yb^{3+}$ is, the higher the upconversion efficiency may be obtained; but the transmittance of the microcrystalline glass prepared thereby would be decreased due to scattering of crystals. It was found by further research that the doping concentration of rare earth ions is 0.5~2 mol %, alternatively 0.5~1.5 mol %, even alternatively 0.5~1.0 mol %, and the microcrystalline glass will have a high upconversion efficiency and a high transmittance (more than 98%).

In a second aspect of the present disclosure, there is provided a display panel comprising a color filter substrate and an array substrate provided opposite to the color filter, wherein the color filter substrate or the array substrate comprises the substrate according to any of the above embodiments, and the display panel further comprises: a liquid crystal layer between the color filter substrate and the array substrate; a reflecting layer on a side of the array substrate which faces the liquid crystal layer, or on other side of the array substrate which is away from the liquid crystal layer; and a polarization structure between the color filter substrate and the liquid crystal layer. For example, the color filter substrate or array substrate comprises the substrate 20 for display panels according to one or more embodiments disclosed in detail above and/or below. Therefore, for an alternative embodiment of the display panel, reference may be made to the embodiments of a substrate for a display panel in the embodiments of the present disclosure.

Figure 4:
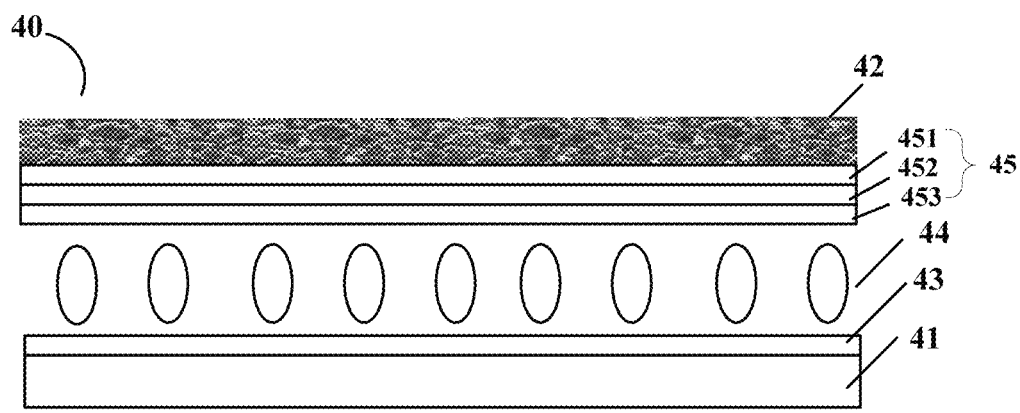
FIG. 4 shows a schematic cross-sectional view of a display panel according to an embodiment of the present disclosure.

FIG. 4 shows a schematic cross-sectional view of a display panel 40 according to an embodiment of the present disclosure. As shown in FIG. 4, the display panel 40 may comprise: a color filter substrate 42, an array substrate 41 arranged opposite to the color filter substrate 42, a liquid crystal layer 44 between the color filter substrate 42 and the array substrate 41, a reflecting layer 43 on a side of the array substrate 41 which faces the liquid crystal layer 44, and a first polarization layer (or polarization structure) 45 between the color filter substrate 42 and the liquid crystal layer 44.

In the embodiment shown in FIG. 4, the color filter substrate 42 may comprise a substrate 20 according to one or more embodiments disclosed above and/or below, the substrate 20 comprising a base 21 doped with upconverting ions capable of converting an infrared light beam into a visible light beam. This type of color filter substrate 42 may convert at least a part of infrared light in ambient light into visible light for use by the display panel 40.

The color filter substrate 42 may further comprise a black matrix and a color filter. The black matrix, for example, may be used to separate pixels in different rows from pixels in different columns to prevent color mixing. The color filter may comprise a red filter, a green filter and a blue filter corresponding to red sub-pixels, green sub-pixels and blue sub-pixels of the display panel respectively. As for other conventional parts or components of the color filter substrate, those skilled in the art may select and arrange as needed, which will not be described in detail herein.

The array substrate 41 may comprise a plurality of thin film transistors arranged in an array. As for other conventional parts or components of the array substrate, those skilled in the art may select and arrange as needed, which will not be described in detail herein.

In an alternative embodiment, as shown in FIG. 4, the first polarization layer 45 may comprise a linear polarizer 451, a half wave plate 452, and a quarter wave plate 453 sequentially arranged on a side which faces the liquid crystal layer.

In the embodiment shown in FIG. 4, the first polarization layer 45 of the display panel 40 is provided on a side of the color filter substrate 42 which is adjacent to the liquid crystal layer 44. In this arrangement, the first polarizing layer 45 not only polarizes ambient light but also polarizes the light that is upconverted by the color filter substrate 42. The polarized light has a desired polarization state after passing through the liquid crystal layer and being reflected by the reflecting layer, so as to achieve the normal display of the display panel. With this arrangement, it is possible to avoid providing the first polarizing layer 45 on both upper and lower sides of the color filter substrate 42. Therefore, the structural complexity of the display panel 40 can be reduced.

Figure 5A:
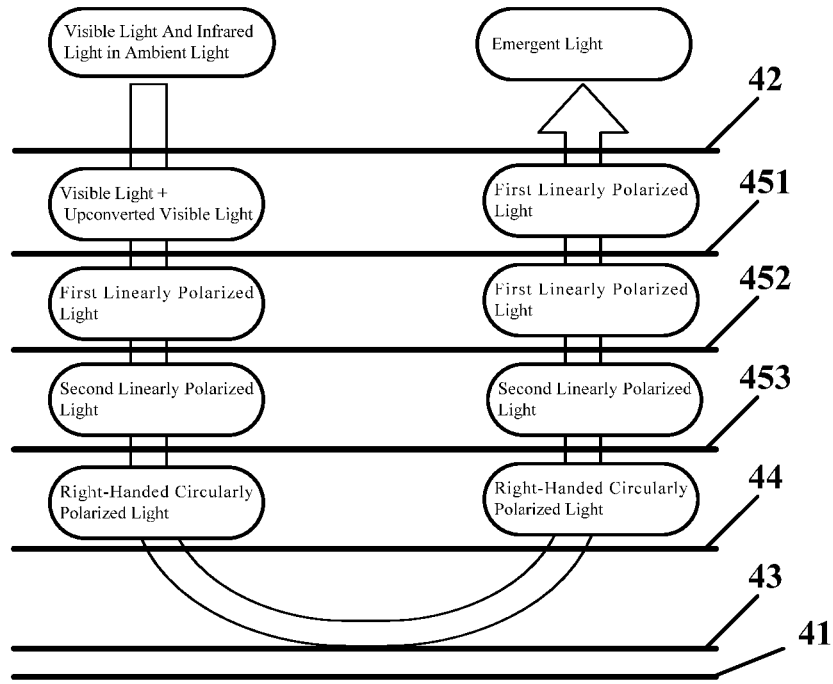
FIG. 5A shows a schematic view of the polarization state of ambient light and upconverted light after spread through each layer of the display panel as shown in FIG. 4 in bright state.
Figure 5B:
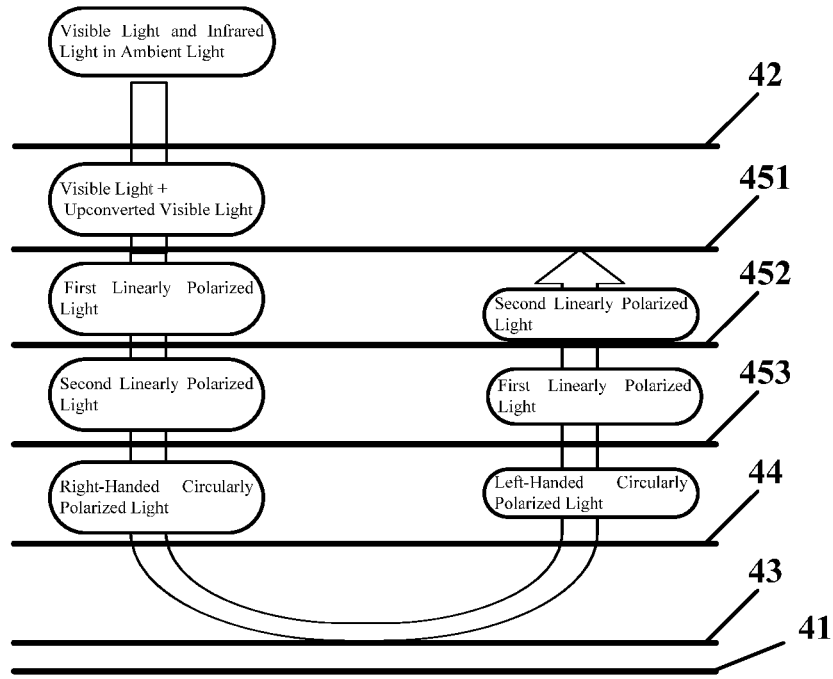
FIG. 5B shows a schematic view of the polarization state of ambient light and upconverted light after spread through each layer of the display panel as shown in FIG. 4 in dark state.

FIG. 5A and FIG. 5B shows a schematic view of the polarization state of ambient light and upconverted light after spread through each layer of the display panel as shown in FIG. 4 in bright state and dark state, respectively.

As shown in FIG. 5A, in bright state, after ambient light is incident on the color filter substrate 42, a part of the ambient light (for example, visible light) may directly pass through the color filter substrate 42 and be incident on the linear polarizer 451, and at least a part of the ambient light is upconverted by the color filter substrate 42 into visible light which is then incident on the linear polarizer 451; visible light that is not upconverted in the ambient light and upconverted light are all natural light that passes through the linear polarizer 451 and then becomes a first linearly polarized light polarized in a first direction (the first direction is the transmission axis direction of the linear polarizer); the linearly polarized light passes through the half-wave plate 452, and then becomes a second linearly polarized light polarized in a second direction perpendicular to the first direction; the second linearly polarized light passes through the quarter wave plate 453, and then becomes a right-handed circularly polarized light. By setting a thickness of the liquid crystal layer and controlling the orientation of the liquid crystal molecules, after the right-handed circularly polarized light passing through the liquid crystal 44, it is reflected by the reflecting layer 41, and the reflected light passes through the liquid crystal layer 44 again, it is still right-handed circularly polarized light. The right-handed circularly polarized light emitted from the liquid crystal layer 44 passes through the quarter-wave plate 453, and then becomes a second linearly-polarized light polarized in the second direction; the second linearly-polarized light passes through the half-wave plate 452, and then becomes a first linearly-polarized light polarized in the first direction; the polarization direction of the first polarized light is the same as the transmission axis direction of the linear polarizer 451, thus the first polarized light can pass through the linear polarizer 451 and then be emitted from the color filter substrate 42 to achieve the bright state display.

As shown in FIG. 5B, in dark state, similarly to FIG. 5A, the visible light in the ambient light and the upconverted visible light after passing through the color filter substrate 42 sequentially pass through the linear polarizer 451, the half-wave plate 452 and the quarter wave plate 453, and then become a right-handed circularly polarized light. By applying a voltage on both sides of the liquid crystal layer 44 to change the orientation of the liquid crystal molecules, the right-handed circularly polarized light passes through the liquid crystal layer 44, and then is reflected by the reflecting layer 41 and passes through the liquid crystal layer 44 again in an opposite direction, and thereby becomes a left-handed circularly polarized light. The left-handed circularly polarized light passes through the quarter wave plate 453 and then becomes a first linearly polarized light polarized in the first direction. The first linearly polarized light passes through the half wave plate 452 and then becomes a second linearly polarized light polarized in the second direction. Since the polarization direction of the second polarized light is perpendicular to the transmission axis direction of the linear polarizer 451, the first polarized light can not pass through the linear polarizer 451. Therefore, the dark state display may be achieved.

In an embodiment of the present disclosure, the first polarization layer 45 may comprise different components or arrangements, thus those skilled in the art may select as needed. For example, the first polarizing layer 45 may only comprise the linear polarizer 451 and the quarter wave plate 453, normal display can still be achieved by setting a thickness of the liquid crystal layer and controlling the orientation of the liquid crystal molecules.

In the embodiment shown in FIG. 4, the first polarizing layer 45 is only provided on a side of the liquid crystal layer 44 which is adjacent to the color filter substrate 42. However, alternatively, a polarization layer may be provided on both sides of the liquid crystal layer 44. As an example, two linear polarizers whose transmission axis directions are perpendicular to each other can be respectively provided on two sides of the liquid crystal layer, and normal display can also be achieved by setting a thickness of the liquid crystal layer and controlling the orientation of the liquid crystal molecules.

In the embodiment shown in FIG. 4, the reflecting layer 43 may be provided on a side of the array substrate 41 which faces to the liquid crystal layer 44. Alternatively, the reflecting layer 43 may be provided on a side of the array substrate 41 which is away from the liquid crystal layer 44.

In an embodiment, the reflecting layer 43 may be a metal coating layer coated on the array substrate 41. In another embodiment, the reflecting layer 43 may be a reflective sheet attached on the array substrate 41.

In a third aspect of the present disclosure, there is provided a display panel which comprises an array substrate comprising the substrate 20 for display panels according to the present disclosure. For example, the array substrate comprises the substrate 20 for display panels according to one or more embodiments disclosed in more detail above and/or below. Therefore, for an alternative embodiment of the display panel, reference may be made to the embodiment of a substrate for a display panel in the embodiments of the present disclosure.

Figure 6:
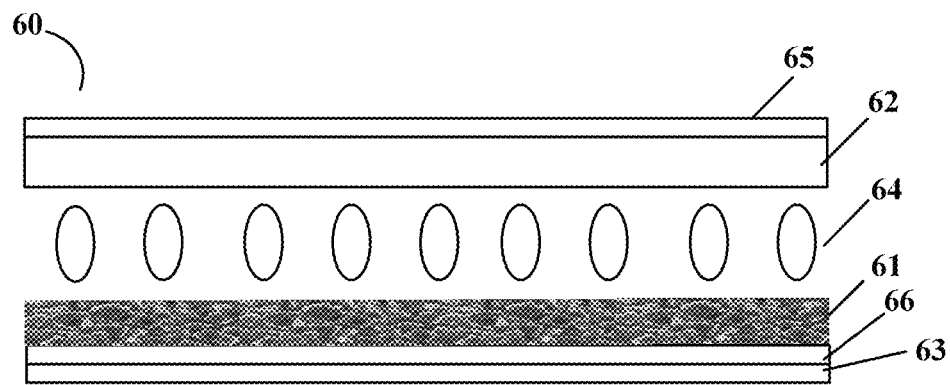
FIG. 6 shows a schematic cross-sectional view of another display panel according to an embodiment of the present disclosure.

FIG. 6 shows a schematic cross-sectional view of another display panel according to an embodiment of the present disclosure. As shown in FIG. 6, the display panel 60 may comprise a color filter substrate 62, an array substrate 61 provided opposite to the color filter substrate 62, a liquid crystal layer 64 between the color filter substrate 62 and the array substrate 61, a reflecting layer 63 on a side of the array substrate 61 which is away from the liquid crystal layer 64, a second polarization layer 65 on a side of the color filter substrate 62 which is away from the liquid crystal layer 64, and a third polarization layer 66 between the reflecting layer 63 and the array substrate 61.

In the embodiment shown in FIG. 6, the array substrate 61 is the substrate 20 for display panels according to one or more embodiments disclosed in detail above and/or below. The substrate 20 comprise a base 21 doped with upconverting ions capable of converting an infrared light beam into a visible light beam. This type of array substrate 61 may convert at least a part of infrared light in ambient light into visible light for use by the display panel 60.

The array substrate 61 may further comprise a plurality of thin film transistors arranged in an array. The color filter substrate 62 may comprise a black matrix and a color filter. As for other conventional parts or components of the array substrate 61 and the color filter substrate 62, those skilled in the art may select and arrange as needed, which will not be described in detail herein.

In this embodiment, in order to enable the display panel 60 to utilize the upconverted light, on the one hand, the reflecting layer 63 is required to be provided on a side of the array substrate 61 away from the liquid crystal layer 64 so as to reflect the upconverted light in the direction of the liquid crystal layer 64; on the other hand, the third polarization layer 66 is also required to be provided between the reflecting layer 63 and the array substrate 61 so that the upconverted light would be polarized.

In the embodiment as shown in FIG. 6, the second polarization layer 65 is located on a side of the color filter substrate 62 which is away from the liquid crystal layer 64. Alternatively, the second polarization layer 65 may be located on a side of the color filter substrate 62 which faces the liquid crystal layer 64.

In the embodiment as shown in FIG. 6, the third polarization layer 66 is located between the array substrate 61 and the reflecting layer 63. Alternatively, the third polarization layer 66 may be located between the array substrate 61 and the liquid crystal layer 64.

In the embodiment as shown in FIG. 6, the second polarization layer 65 and the third polarization layer 66 may be linear polarizers, and the transmission axis directions thereof are perpendicular to each other. It can be understood that the second polarization layer and the third polarization layer may further comprise other types of polarization elements as needed.

In this embodiment, the bright state and the dark state display of the display panel 60 can be achieved by setting a thickness of the liquid crystal layer 64 and controlling the suitable orientation of the liquid crystal molecules. In particular, the ambient light can be fully utilized by converting at least a part of the infrared light into visible light by the array substrate 61 in order to improve the brightness of the display panel.

Figure 7A:
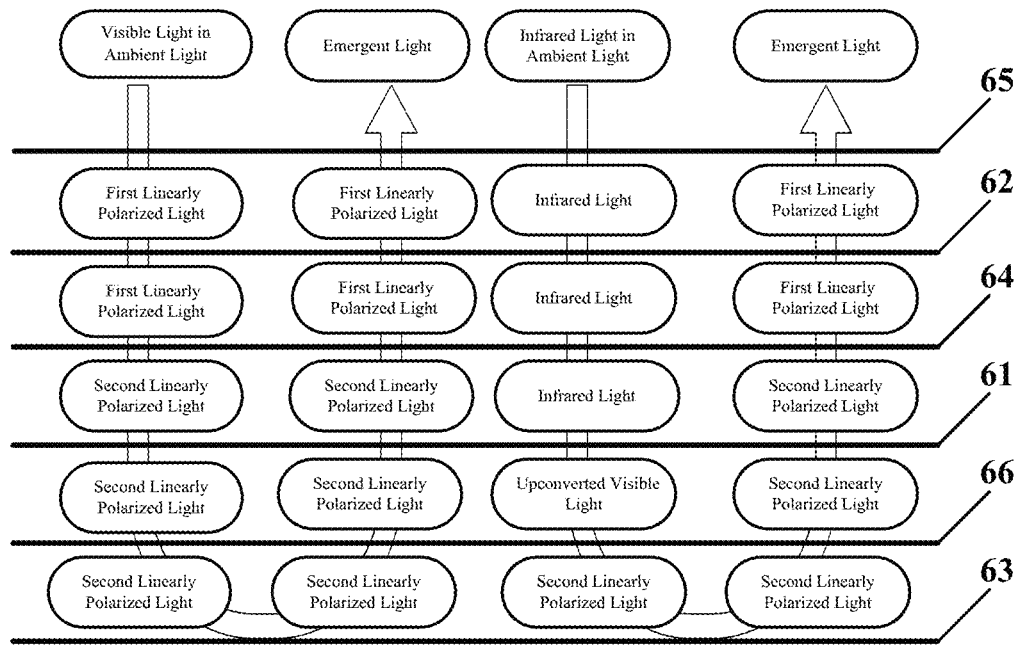
FIG. 7A shows a schematic view of the polarization state of ambient light and upconverted light after spread through each layer of the display panel as shown in FIG. 6 in bright state.
Figure 7B:
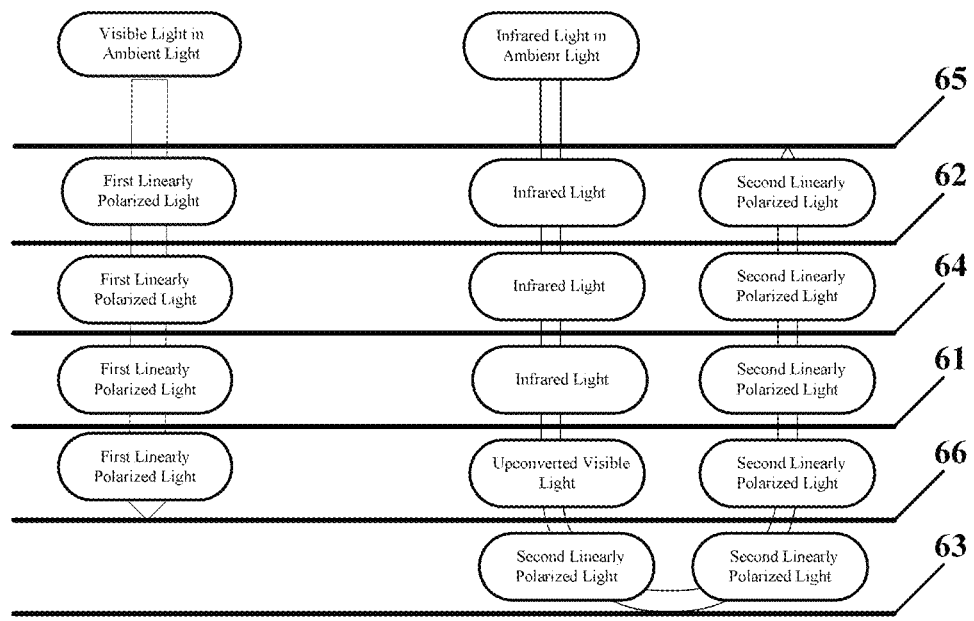
FIG. 7B shows a schematic view of the polarization state of ambient light and upconverted light after spread through each layer of the display panel as shown in FIG. 6 in dark state.

FIG. 7A and FIG. 7B shows a schematic view of the polarization state of ambient light and upconverted light after spread through each layer of the display panel as shown in FIG. 6 in bright state and dark state, respectively.

As shown in FIG. 7A, in bright state, as for visible light part in the ambient light, the visible light passes through the second polarization layer 65 and becomes a first linearly polarized light polarized in a first direction (for example, the X direction). After the first linearly polarized light passes through the color filter substrate 62, it is still the first linearly polarized light polarized in the first direction. By setting a thickness of the liquid crystal layer 64 and controlling the orientation of the liquid crystal, the polarization state of the first linearly polarized light is rotated by 90° after passing through the liquid crystal layer, that is, the first linearly polarized light becomes a second linearly polarized light that is polarized in a second direction (for example, the Y direction). The second linearly polarized light may sequentially pass through the array substrate 61 and the third polarizing layer 66 whose transmission axis direction is the second direction perpendicular to the first direction.

As for infrared light part in the ambient light, at least a part of the infrared light is upconverted into visible light after passing through the array substrate 61 doped with the upconverting ions, and the upconverted visible light becomes a second linearly polarized light polarized in the second direction after passing through the third polarizing layer 66. Whether the visible light in the ambient light or the upconverted visible light in the infrared light, both of them become a second linearly polarized light polarized in the second polarization direction after passing through the third polarization layer.

Since the reflecting layer does not change the polarization state of the linearly polarized light, the second linearly polarized light is still that polarized in the second direction after being reflected by the reflecting layer. The second linearly polarized light is still polarized in the second direction after sequentially passing through the third polarizing layer 66 and the array substrate 61. After passing through the liquid crystal layer, the second polarized light becomes first linearly polarized light polarized in the first direction, and the first linearly polarized light sequentially passes through the color filter substrate 62 and the second polarizing layer 65 and emits, so as to achieve the bright state display.

As shown in FIG. 7B, in dark state, as for visible light part in the ambient light, the visible light passes through the second polarization layer 65 and becomes a first linearly polarized light polarized in a first direction (for example, the X direction). After the first linearly polarized light passes through the color filter substrate 62, it is still the first linearly polarized light polarized in the first direction. By setting a thickness of the liquid crystal layer 64 and controlling the orientation of the liquid crystal, the polarization state of the first linearly polarized light is unchanged after passing through the liquid crystal layer, that is, it is still the first linearly polarized light polarized in the first direction. The first linearly polarized light can not pass through the third polarization layer 66 whose transmission axis direction is the second direction. Therefore, the visible light in ambient light can not be used for display.

As for infrared light in the ambient light, at least a part of the infrared light is upconverted into visible light after passing through the array substrate 61 doped with the upconverting ions, and the upconverted visible light becomes a second linearly polarized light polarized in the second direction after passing through the third polarizing layer 66. The second linearly-polarized light after being reflected by the reflecting layer 63 and passing through the third polarization layer 66 is still the second linearly-polarized light. Since the liquid crystal layer does not change the polarization state of the light, the second polarized light is still that polarized in the second direction after passing through the liquid crystal layer. The second linearly polarized light can not pass through the second polarization layer 65 whose transmission axis direction is perpendicular to the polarization direction of second linearly polarized light. Therefore, the infrared light in ambient light can not be used for display in dark state.

In a fourth aspect of present disclosure, there is provided a display panel comprising: a coverplate comprising the substrate 20 for display panels according to the present disclosure, for example, the substrate 20 for display panels according to one or more embodiments disclosed above and/or below. Therefore, for an alternative embodiment of the display panel, reference may be made to the embodiment of a substrate for a display panel in the embodiments of the present disclosure.

Figure 8:
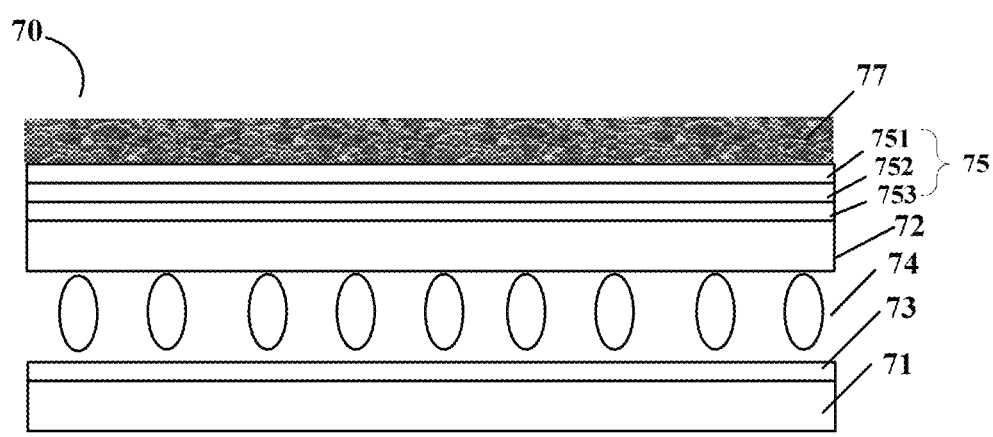
FIG. 8 shows a schematic cross-sectional view of yet another display panel according to an embodiment of the present disclosure.

FIG. 8 shows a schematic cross-sectional view of yet another display panel 70 according to an embodiment of the present disclosure. As shown in FIG. 8, the display panel 70 may comprise a coverplate 77, a color filter substrate 72, an array substrate 71 provided opposite to the color filter substrate 72, a liquid crystal layer 74 between the color filter substrate 72 and the array substrate 71, a fourth polarization layer 75 between the color filter substrate 72 and the coverplate 77, and a reflecting layer 73 on a side of the array substrate 71 which faces the liquid crystal layer 74.

In the embodiment as shown in FIG. 8, the coverplate 77 may be the substrate 20 for display panel in one or more embodiments disclosed above and/or below, the substrate 20 comprising a base 21 doped with upconverting ions capable of converting an infrared light beam into a visible light beam. The coverplate 77 in the embodiment may convert at least a part of infrared light in ambient light into visible light for use by the display panel 70.

In the embodiment as shown in FIG. 8, the fourth polarization layer 75 may be located on a side of the color filter substrate 72 which is away from the liquid crystal layer 74, that is, located between the cover plate 77 and the color filter substrate 72. Alternatively, the fourth polarization layer 75 may be located on a side of the color filter substrate 72 which faces to the liquid crystal layer 74.

The fourth polarization layer 75 comprises a linear polarizer 751, a half wave plate 752, and a quarter wave plate 753. In an embodiment of the present disclosure, the fourth polarization layer 75 may have different components or arrangements, for example, the fourth polarization layer 75 only comprises a linear polarizer 751 and a quarter wave plate 753.

In the embodiment as shown in FIG. 8, the reflecting layer 73 may be located on a side of the array substrate 71 which faces to the liquid crystal layer 74. Alternatively, the reflecting layer 73 may be located on a side of the array substrate 71 which is away from the liquid crystal layer 74.

The foregoing description of the embodiment has been presented for purpose of illustration and description. It is not intended to be exhaustive or to limit the application. Individual elements or features of a particular embodiment are generally not limited to that particular embodiment, but, where applicable, are interchangeable and may be used in a selected embodiment, even if not specifically shown or described. Likewise, they may also be varied in many ways. Such variations are not to be regarded as a departure from the application, and all such modifications are included within the scope of the application.

The invention claimed is:

1. A display panel, comprising a color filter substrate and an array substrate provided opposite to the color filter, wherein the color filter substrate comprises a substrate provided thereon that has a base doped with upconverting ions capable of converting an infrared light beam into a visible light beam, wherein the base is made of microcrystalline glass, and the microcrystalline glass comprises at least one of matrix materials $NaYF_4$ and $NaGdF_4$, and the display panel further comprises:
    a liquid crystal layer between the color filter substrate and the array substrate;
    a reflecting layer on a first side of the array substrate which faces the liquid crystal layer, or on a second side of the array substrate which is away from the liquid crystal layer; and
    a polarization structure between the color filter substrate and the liquid crystal layer,
    wherein the polarization structure comprises a first polarization layer between the color filter substrate and the liquid crystal layer, and the first polarization layer comprises a linear polarizer and a quarter wave plate sequentially arranged on a side of the color filter substrate which faces the liquid crystal layer.

2. The display panel according to claim 1, wherein the microcrystalline glass comprises 65 mol % to 70 mol %

$SiO_2$, 5 mol % to 10 mol % $Ba_2O_3$, 5 mol % to 10 mol % $Na_2O$, 5 mol % to 10 mol % NaF, and 5 mol % to 10 mol % $GdF_3$.

3. The display panel according to claim 1, wherein the microcrystalline glass comprises 65 mol % to 70 mol % $SiO_2$, 5 mol % to 10 mol % $Ba_2O_3$, 5 mol % to 10 mol % $Na_2O$, 5 mol % to 10 mol % NaF, 0.5 mol % to 5 mol % $YF_3$.

4. The display panel according to claim 1, wherein, based on the total molar content of the matrix materials, each of the upconverting ions is doped at a molar ratio of 0.5-2 mol %.

5. The display panel according to claim 1, wherein, based on the total molar content of the matrix materials, each of the upconverting ions is doped at a molar ratio of 0.5-1.5 mol %.

6. The display panel according to claim 1, wherein, based on the total molar content of the matrix materials, each of the upconverting ions is doped at a molar ratio of 0.5-1.0 mol %.

7. The display panel according to claim 1, wherein the polarization structure further comprises a half wave plate between the liquid crystal layer and the reflecting layer.

8. A display device, comprising the display panel according to claim 1.

9. A display panel comprising:
a coverplate comprising a substrate that has a base doped with upconverting ions capable of converting an infrared light beam into a visible light beam, wherein the base is made of microcrystalline glass, and the microcrystalline glass comprises at least one of matrix materials $NaYF_4$ and $NaGdF_4$;
a color filter substrate;
an array substrate provided opposite to the color filter substrate;
a liquid crystal layer between the color filter substrate and the array substrate;
a fourth polarization layer on a first side of the color filter substrate which faces the liquid crystal layer, or on a second side of the color filter substrate which is away from the liquid crystal layer, wherein the fourth polarization layer comprises a linear polarizer and a quarter wave plate sequentially arranged on a side of the color filter substrate which faces the liquid crystal layer; and
a reflecting layer on a first side of the array substrate which faces the liquid crystal layer, or on a second side of the array substrate which is away from the liquid crystal layer.

10. The display panel according to claim 9, wherein the display panel further comprises a half wave plate between the liquid crystal layer and the reflecting layer.

11. A display device, comprising the display panel according to claim 9.

12. A display panel, comprising a color filter substrate and an array substrate provided opposite to the color filter, wherein a substrate is provided on the array substrate that has a base doped with upconverting ions capable of converting an infrared light beam into a visible light beam, wherein the base is made of microcrystalline glass, and the microcrystalline glass comprises at least one of matrix materials $NaYF_4$ and $NaGdF_4$, and the display panel further comprises:
a liquid crystal layer between the color filter substrate and the array substrate;
a reflecting layer on a first side of the array substrate which faces the liquid crystal layer, or on a second side of the array substrate which is away from the liquid crystal layer; and
a polarization structure between the color filter substrate and the liquid crystal layer,
wherein the polarization structure comprises a second polarization layer on a first side of the color filter substrate which faces the liquid crystal layer, or on a second side of the color filter substrate which is away from the liquid crystal layer, and
wherein a third polarization layer is provided between the liquid crystal layer and the reflection layer.

13. The display panel according to claim 12, wherein, based on the total molar content of the matrix materials, each of the upconverting ions is doped at a molar ratio of 0.5-2 mol %.

14. A display device, comprising the display panel according to claim 12.

* * * * *